(12) United States Patent
Maciorowski et al.

(10) Patent No.: US 10,571,954 B2
(45) Date of Patent: Feb. 25, 2020

(54) PRIORITIZATION FOR A SET OF DATA SIGNALS BASED ON SKEW REQUIREMENTS

(71) Applicant: HEWLETT PACKARD ENTERPRISE DEVELOPMENT LP, Houston, TX (US)

(72) Inventors: David Maciorowski, Fort Collins, CO (US); Christopher Kroeger, Fort Collins, CO (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/767,867

(22) PCT Filed: Apr. 25, 2016

(86) PCT No.: PCT/US2016/029138
§ 371 (c)(1),
(2) Date: Apr. 12, 2018

(87) PCT Pub. No.: WO2017/188920
PCT Pub. Date: Nov. 2, 2017

(65) Prior Publication Data
US 2018/0307264 A1  Oct. 25, 2018

(51) Int. Cl.
*G06F 1/10* (2006.01)
*H04L 12/46* (2006.01)
*G06F 17/50* (2006.01)
*H04L 12/54* (2013.01)
*G06F 1/12* (2006.01)
*H04L 12/70* (2013.01)

(52) U.S. Cl.
CPC .................. *G06F 1/10* (2013.01); *G06F 1/12* (2013.01); *G06F 17/5054* (2013.01); *H04L 12/4625* (2013.01); *H04L 12/54* (2013.01); *H04L 12/56* (2013.01); *H04L 2012/5681* (2013.01)

(58) Field of Classification Search
CPC .......... G06F 1/10; G06F 1/12; G06F 17/5054; H04L 12/56; H04L 12/4625; H04L 12/54; H04L 2012/5681
USPC ........................................................ 327/141
See application file for complete search history.

(56) References Cited

U.S. PATENT DOCUMENTS 7,634,753 B2 * 12/2009 Reynolds ......... H03K 19/17736
716/128
8,237,058 B2 *  8/2012 Freda ................... H05K 1/0248
174/251

(Continued)

OTHER PUBLICATIONS

International Search Report & Written Opinion received in PCT Application No. PCT/US2016/029138, dated Jan. 17, 2017, 12 pages.

(Continued)

*Primary Examiner* — Ryan Jager
(74) *Attorney, Agent, or Firm* — Hewlett Packard Enterprise Patent Department

(57) ABSTRACT

Examples herein disclose an identification of a set of skew requirements corresponding to a set of data signals. Based on the set of skew requirements, the examples prioritize an order of transmission for the set of data signals. The example queue the set of data signals in accordance with the prioritized order.

19 Claims, 6 Drawing Sheets

(56) References Cited

U.S. PATENT DOCUMENTS

| | | | |
|---|---|---|---|
| 8,806,262 B2* | 8/2014 | Bennett | G06F 13/4243 370/357 |
| 2008/0126888 A1* | 5/2008 | Haas | H04L 1/242 714/700 |
| 2011/0185241 A1* | 7/2011 | Erickson | G06F 11/3632 714/724 |
| 2011/0221497 A1* | 9/2011 | Chong | G01R 31/3016 327/161 |
| 2013/0201996 A1* | 8/2013 | Masputra | H04L 47/60 370/412 |
| 2014/0273627 A1 | 9/2014 | Cartier, Jr. et al. | |
| 2015/0067273 A1 | 3/2015 | Strauss et al. | |
| 2015/0087273 A1* | 3/2015 | Goldstein | H04M 3/42051 455/412.1 |

OTHER PUBLICATIONS

Ragab, A. et al., "Receiver Jitter Tracking Characteristics in High-speed Source Synchronous Links," (Research Paper), Aug. 22, 2000, 10 pages, http://www.hindawi.com/journals/jece/2011/982314/.

* cited by examiner

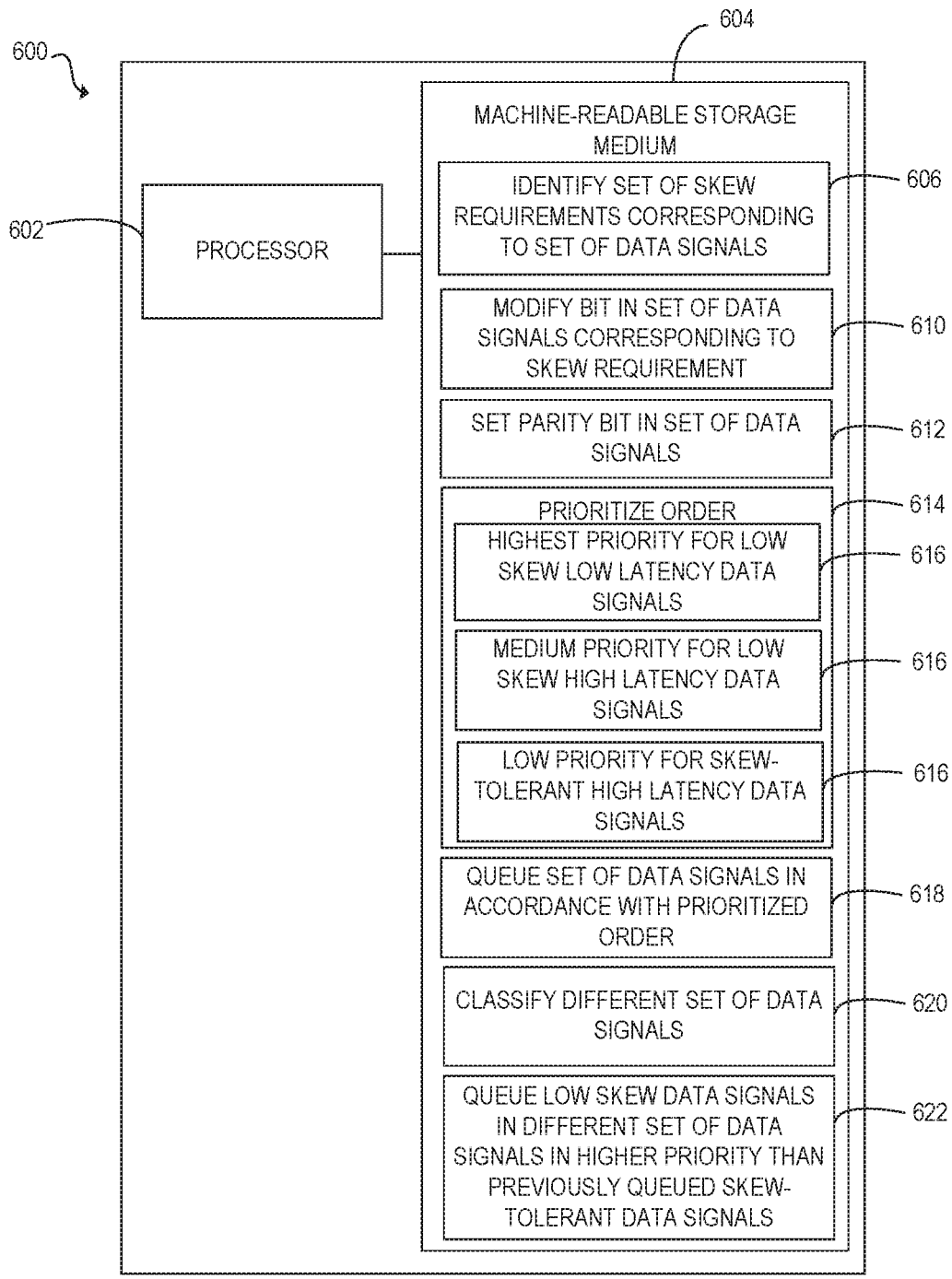

PRIORITIZATION FOR A SET OF DATA SIGNALS BASED ON SKEW REQUIREMENTS

CROSS-REFERENCE TO RELATED APPLICATION

This application is the National Stage of International Application No. PCT/US2016/029138, filed on Apr. 25, 2016, the content of which are incorporated herein by reference in its entirety.

BACKGROUND

In transmission of data signals, there may be several design considerations to satisfy skew requirements. Data signal skew is a time difference between two different components asserting a data signal. The assertion of data signal is a time it takes for a data signal to go from low to high or vice versa at each component. Each data signal may have a different skew tolerance requirement. For example, some data signals can tolerate trace amounts of skew while other data signals may tolerate a large amount of skew, such as many microseconds.

BRIEF DESCRIPTION OF THE DRAWINGS

In the accompanying drawings, like numerals refer to like components or blocks. The following detailed description references the drawings, wherein:

FIG. 6 is a block diagram of an example computing device with a processing resource to execute instructions in a machine-readable storage medium for transmitting a set of data signals based on a prioritized order of the data signal set in accordance with the present disclosure.

DETAILED DESCRIPTION

Figure 1:
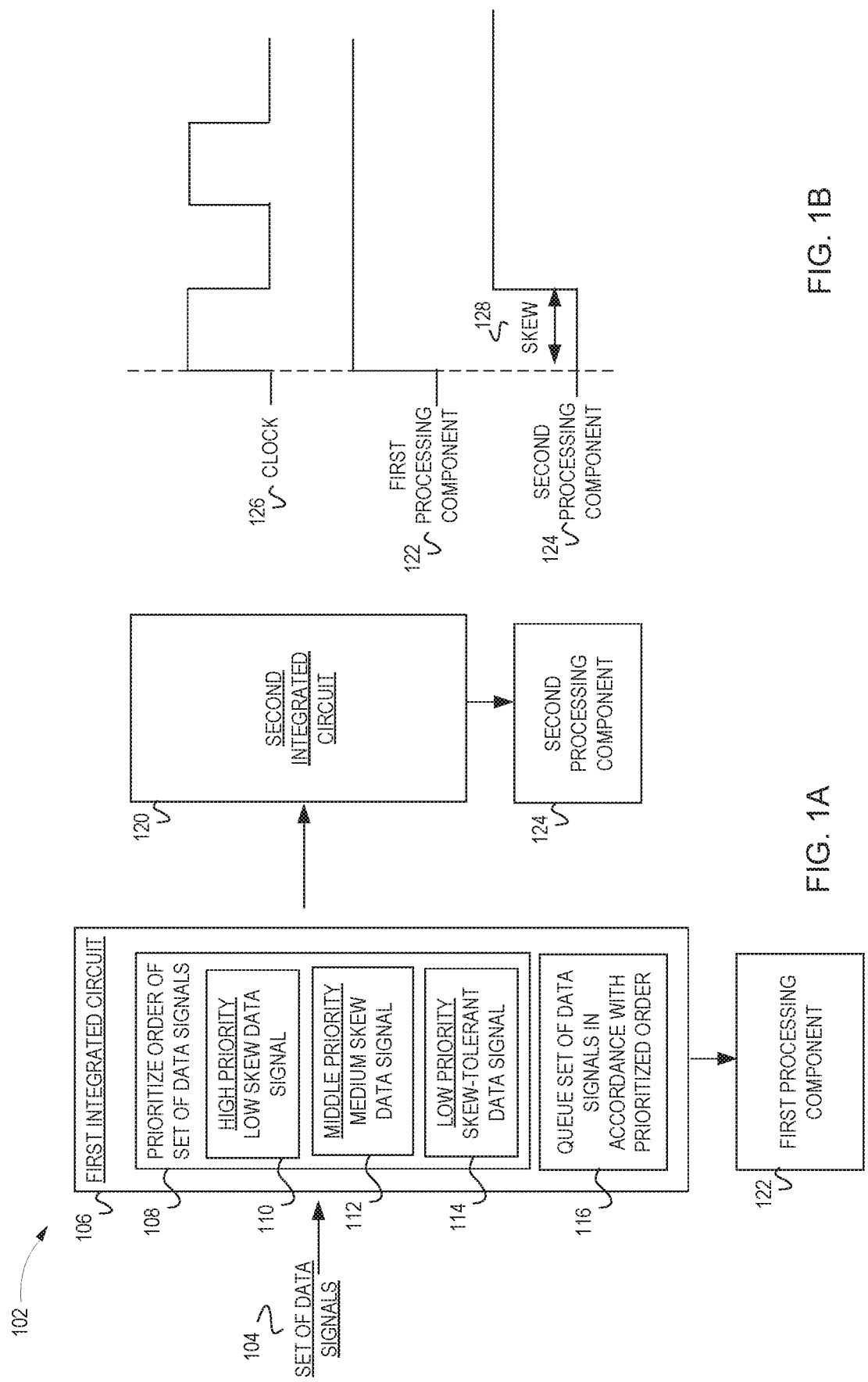
FIG. 1A illustrates an example system including a first integrated circuit to prioritize an order of a data signal set for transmission to a second integrated circuit in accordance with the present disclosure.
FIG. 1B illustrates an example clock signal and corresponding skew for a data signal.

To comply with these skew tolerance rates, there are several approaches. In one approach, a connector pin may be wired directly in a point-to-point configuration so that each data signal is immediately transmitted; however the point-to-point configuration increases both board space and connectors. In another approach, data signals may be moved from one location to another over a shift register chain; however this approach may result in unacceptable amounts of skew. For example, as a number of data signals increase, so does the skew in the shift register approach. As such, the size and performance of systems may be limited by signal skew.

The present disclosure provides a mechanism to reduce an amount of board space and connector pin count while also efficiently managing skew requirements of the data signals. The disclosure is implemented on an integrated circuit to identify a level of skew (e.g., low, medium and skew-tolerant) for each data signal. In turn based on the level of skew in the set of skew requirements, the disclosure prioritizes an order for transmission of the data signals. Based on the prioritized order, the data signal set is queued for transmission. By prioritizing the traffic (e.g., data signals), this allows the data signals corresponding to low skew levels to be transferred ahead of skew-tolerant (high skew) data signals.

Additionally, separating low skew data signals from medium skew and high skew (e.g, skew-tolerant) data signals allows deterministic timing on the low skew data signals since there are fewer potentially queued messages ahead of these signals. This allows a single bus to be shared from one integrated circuit to another integrated circuit for the signal transmission. Using the single bus reduces an amount of board space and the number of connectors used to transmit the data signals.

In another example, a type of the data signal may define the level of skew. In this example, some types of data signals are correlated with lower skew rates, while other types of data signals may be correlated with higher skew rates. For example, a data signal related to an interrupt and/or reset may be associated with a lower skew level. The lower skew level may be based on asserting these data signals close in time at the components for synchronization purposes.

In a further example, the disclosure provides a bridge system including a first integrated circuit and second integrated circuit. Each integrated circuit may transmit data signals with a respective processor for synchronization. Thus each circuit may prioritize the data signal set based on the level of skew. The bridge system provides a synchronization of data signals using a serial interface to prioritize which traffic may be transferred ahead of other traffic.

The following detailed description refers to the accompanied figures. Wherever possible, the same reference numbers are used in the figures and the following description to refer to the same or similar parts. It is to be expressly understood, however, that the figures are for the purpose of illustration and description only. While several examples are described throughout, modification, adaptions, and other implementations are possible. Accordingly, the following detailed description is not meant to limit the disclosed examples, rather it is meant to provide proper scope of the disclosed examples and may be defined by the appended claims.

FIG. 1A is a block diagram of an example system 102 including first integrated circuit 106 and second integrated circuit 120. First integrated circuit 106 receives data signal set 104 and prioritizes an order of data signal set 104 at module 108. At module 108, first integrated circuit 106 identifies a set of skew requirements including various skew requirements 110-114. The set of skew requirements include the various classes of skew a data signal may tolerate. These classes include low skew data signal 110, medium skew data signal 112, and skew-tolerant data signal 114. Based on the classes of the various skew requirements 110-114, first integrated circuit 106 prioritizes the data signal set 104. Based on prioritizing an order for transmission of the data signal set 104 at module 108, first integrated circuit 106 proceeds to queue data signal set 104 for transmission. The data signal set 104 may be transmitted to first processing component 122 for assertion of the data signal and to second integrated circuit 120 for assertion at second processing component 124. Asserting the data signal at both processing components 122 and 124 allows system 102 to synchronize. As such, system 102 as illustrated in FIG. 1A represents a data network in which integrated circuits 106 and 120 operate in conjunction to represent a single overall system. For example, first integrated circuit 106 may operate in one server, while second integrated circuit 120 operates in a different server, thus system 102 illustrates the overall single system with both of these servers operating in conjunction. As such implementations of system 102 include, by way of example, a database server, mail server, file server, domain name system (DNS) server, print server, web server, game server, application server, cartridge server, blade server, catalog server, communication server, home server, media server, proxy server, or other type of computing device(s) capable of operating in conjunction with one another to present an overall single system.

Set of data signals 104, also referred to as data signal set herein, are signals relaying information to receiving entities. The data signal set 104 relay types of functions in which to synchronize between integrated circuits 106 and 120 and/or processing components 122 and 124. For example, a data signal may include a system reset, thus to get both processing components 122 and 124 to reset within an acceptable skew range, this data signal should be synchronized between components 122 and 124. This ensures both components 122 and 124 are reacting within a tolerable time period. Data signal set 104 represents various data signals which may each include a skew class (e.g., low skew, medium skew, skew-tolerant, etc.) from the set of skew requirements. In one implementation, the format of each data signal include a 16 bit signal format. In this example, bits 0-7 include payload information while bits 8-15 include other identifying information. In this implementation, one of the bits (bits 8-15) may be modified to represent the class of skew (e.g., low skew data signal, skew-tolerant data signal, etc.). Another bit may be used to set a parity bit. In this example, the parity bit is set for the receiving entity (e.g., second integrated circuit 120) to use the parity bit to check whether the transmitted data signal includes an error.

First integrated circuit 106 is hardware component part of system 102 that prioritizes the order of data signal set 104 based on the set of skew requirements 110-114. First integrated circuit 106 is an electronic circuit formed on semiconductor material to provide electrical connections using conductive tracks, pins, pads, or other features between circuits 106 and 120 and/or processing components 122 and 124. As such implementation of first integrated circuit 106 include, by way of example, a central processing unit (CPU), processor, semiconductor, processing resource, controller, microcontroller, field programmable gate array (FPGA), or other type of hardware component capable of the functionality of first integrated circuit 106.

Module 108 prioritizes the order for transmitting data signal set 104 based on the set of skew requirement classes (e.g., low, medium, tolerant). Module 108 prioritizes the order of transmission for data signal set 104 such that the prioritization provides a serialization in which to transmit each of the data signals to second integrated circuit 120. In this manner, each data signal in set 104 is prioritized to identify a sequential order of when to transmit to second integrated circuit 120. In this implementation, those data signals which are identified as the class of low skew data signals 110 are given the highest priority and transmitted before other classes 112 and 114. The medium skew data signals 112 are given middle priority and transmitted on the same bus as low skew data signals 110, but are transmitted after low skew data signals 110 and prior to skew-tolerant data signals 114. The skew-tolerant data signals 114 are given the lowest priority and are the last class of data signals to be transmitted on the same bus as the other skew classes 110-112. The skew class (e.g., low, medium, tolerant) is based on a type of each data signal. For example, data signals related to fault management are considered low-skew data signals and these should be prioritized for initial transmission. Data signals related to power management may be considered skew-tolerant data signals as it takes several milliseconds for second integrated circuit 120 to react to receiving these signals, thus these data signals are in lowest priority for transmission. Module 108 may include, by way of example, instructions (e.g., stored on a machine-readable medium) that, when executed (e.g., by integrated circuit 106 and/or 120), implement the functionality of module 108. Alternatively, or in addition, module 108 may include electronic circuitry (i.e., hardware) that implements the functionality of module 108.

Set of skew requirements 110-114 represent the various classes or levels of skew corresponding to a given data signal in set 104. In one implementation, the class of skew may be dependent on the type of data signal. This information may be pre-defined by a developer to classify which class of skews should correspond to which type of data signal. For example, those signals which may be highest priority and lowest skew may be related to fault issues, interrupts, etc. Those signals which may be lowest in priority and higher skew (e.g., skew-tolerant) may be related to power management, etc.

Low skew data signals 110 are given the highest priority as these signals represent those data signals which may tolerate a small amount of skew. To provide context, the skew in this class of data signals may be less than a few nanoseconds (e.g., 2 ns). Low skew data signals 110 may also be referred to as "fast signals" as these signals should transmitted in the highest priority. In a further implementation, low skew data signals 110 also tolerate a lower amount of latency. Latency is the transmission time for the data signal to leave first integrated circuit 106 and arrive at second integrated circuit 120.

Medium skew data signals 112 are those signals which may tolerate a little more skew than low skew data signals, but less skew than skew-tolerant data signals. To provide context, the skew in this class of data signals is less than a few microseconds (e.g., 2 us). Medium skew data signals may also be referred to as "fast-sync signals" as these signals should be asserted from integrated circuits 106 and/or 120 for assertion at respective processing component 122 and 124. The fast-sync signals, unlike fast signals, may tolerate a higher amount of latency and should be asserted at the same clock rising edge. For example, fast-sync signals may be related to a reset function and as such, for these signals to be synchronized simultaneously, these signals have be transmitted from integrated circuits 106 and 120 at the same rising clock edge to ensure synchronization at processing components 122 and 124. In other words, by transmitting fast-sync signal at the same clock edge ensures each data signal is asserted at each processing component 122 and 124 at the same time.

Skew-tolerant data signals 114 are given lowest priority as these signals represent those signals which can tolerate a larger amount of skew than low skew data signals 110 and medium skew data signals 112. Synchronization of these signals at each integrated circuit 106 and 120 and processing components 122 and 124 are less consequential. To provide context, the larger amount of skew may include several microseconds (e.g., 50 us). Skew-tolerant data signals 112 may also be referred to as "slow signals" as the transmission of these signals are lowest in priority. In a further implementation skew-tolerant data signals 114, unlike low skew data signals 110, tolerate a larger amount of latency.

Module 116 queues the data signal set 104 in accordance with the prioritized order. Those data signals given the highest priority are transmitted initially, followed by middle priority, and then lowest priority. As such, first integrated circuit 106 may additionally include a memory component (not illustrated) which module 116 places or queues the prioritized data signals for transmission. Module 116 may include, by way of example, instructions (e.g., stored on a machine-readable medium) that, when executed (e.g., by first integrated circuit 106), implements the functionality of module 116. Alternatively, or in addition, module 116 may include electronic circuitry (i.e., hardware) that implements the functionality of module 116.

Second integrated circuit 120 may receive the prioritized data signal set from first integrated circuit 106. Second integrated circuit 120 is an electronic circuit formed on semiconductor material to provide electrical connections using conductive tracks, pins, pads, or other features between circuits 106 and 120 and/or processing components 122 and 124. As explained earlier, second integrated circuit 120 operates in conjunction with first integrated circuit 106 to provide a serial interface for traffic prioritization to synchronize particular data signals at respective processing component 122 and 124. In this example, integrated circuits 106 and 120 operate in conjunction to synchronize functionalities by transmitting data signals to each respective processing component 122 and 124. For example, second integrated circuit 120 may also include additional functionality (not illustrated) capable of prioritizing data signals based on skew requirements to first integrated circuit 106 and second processing component 124. In this example, each integrated circuit 106 and 120 operates independently of each other to send the prioritized set of data signals 104 to the other integrated circuit 106 and 120. Each integrated circuit 106 and 120 may proceed to send transmitted data signals to each respective processing component 122 and 124.

FIG. 1B illustrates an example clock signal 126 and skew 128 between first processing component 122 and second processing component 124. In this example, the assertion from first processing component 122 is closely synced to the clock 126 rising edge. The assertion from second processing component 124 is further from the clock 126 rising edge. Thus, skew 128 is the time difference between the assertions at first processing component 122 and second processing component 124. The assertion is considered the time it takes for a data signal at the respective processing component 122 and 124 to change state, such as low to high and vice versa. For example, the assertion is the time at each processing component 122 and 124 to go from low to high based on the transmitted data signal. In this example, the assertion for the first processing component 122 occurs prior to the assertion at second processing component 124. Although FIG. 1B illustrates assertion occurring at first processing component 122 prior to assertion at second processing component 124, this was done for illustration purposes as second processing component 124 may assert prior to first processing component 122.

Figure 2:
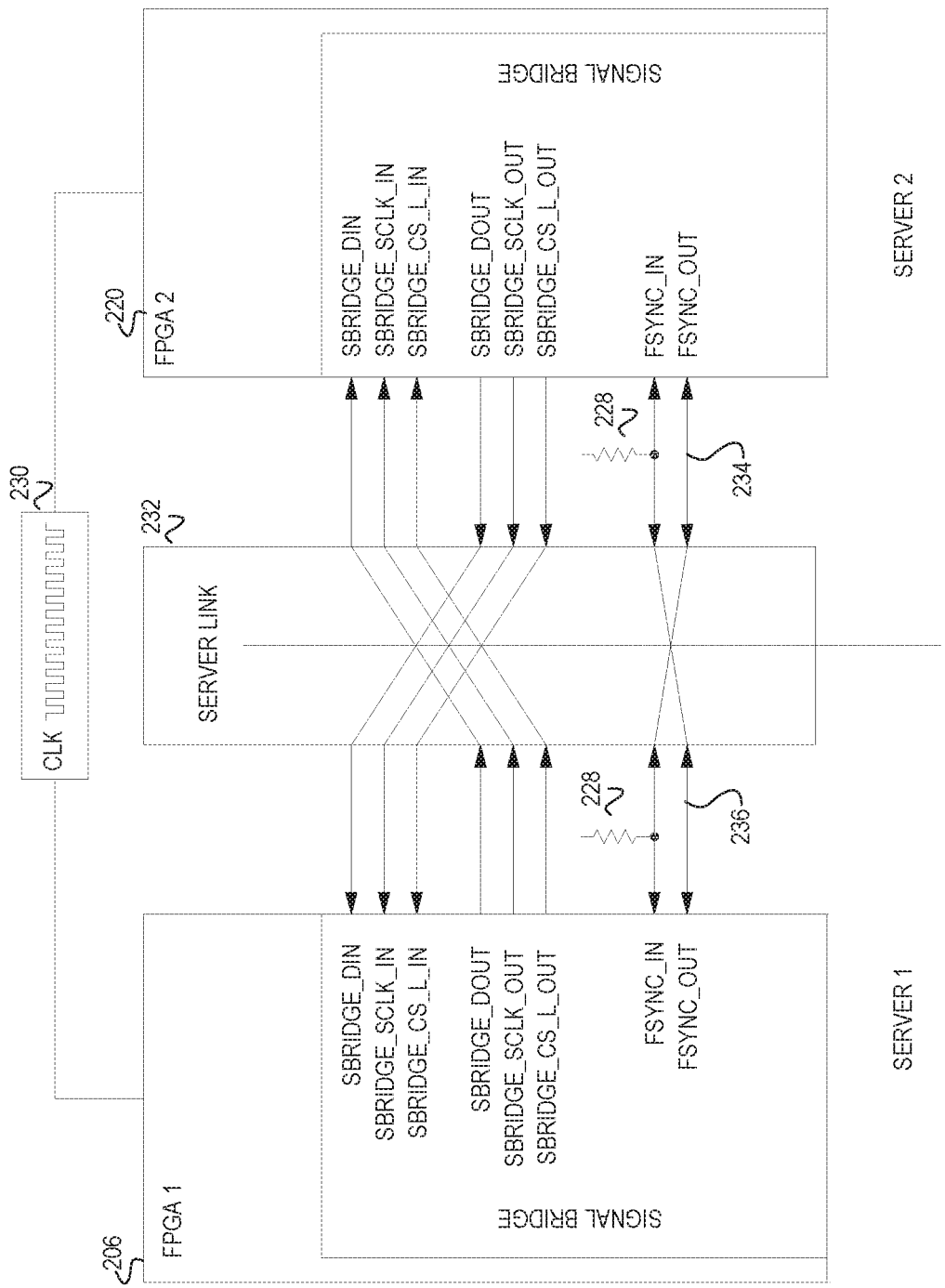
FIG. 2 illustrates an example bridge system including connections between first integrated circuit and second integrated circuit in accordance with the present disclosure.

FIG. 2 illustrates an example bridge system showing connections between first field programmable array (FPGA 1) 206 and second field programmable (FPGA 2) 220. The FPGAs 206 and 220 represent a type of integrated circuit in accordance with the present disclosure. As illustrated with the electrical connections, each FPGA 206 and 220 supports full duplex capabilities. In the full duplex system, each FPGA 206 and 220 can communicate with each other simultaneously. Thus by providing the full duplex system, data signals can be prioritized by FPGA 206 and transmitted to FPGA 220 while data signals can be prioritized by FPGA 220 and transmitted to FPGA 206. In this example, both FPGAs 206 and 220 include the circuitry and/or functionality in which to implement the prioritization of traffic based on a level of skew. Additionally, each FPGA 206 and 220 are positioned in a different server (Server 1 and Server 2). Server link 232 couples together FPGAS 206 and 220 such that the servers operate together to provide one overall server system. To provide the overall system, clock 230 may be used to provide a timing mechanism for transmitting low skew data signals (e.g., fast signals) and medium skew data signals (e.g., fast-synch signals).

Clock 230 may include a synchronization clock and is coupled between FPGAs 206 and 220. Clock 230 provides the timing mechanism for each FPGA to transmit the fast data signals and fast-synch data signals. In this example, based on a rising edge from clock 230, FPGA 206 and 220 may push out these data signals. Waiting for the rising edge from clock 230 ensures the fast data signals and fast-sync data signals may be synchronized. In a further example each FPGA 206 and 220 is connected to a respective processing component (not illustrated). In this example, upon clock 230 reaching the rising edge, each FPGA 206 and 220 transmits the data signal to each processing component for synchronizing the transmitted data signal between both processing components.

Serial bus 236, coupled between both FPGAs 206 and 220, provides the transmission medium for transmitting the prioritized data signals from FPGA 206 to FPGA 220. In turn, FPGA 220 may prioritize another data signal set and transmit the prioritized data signals to FPGA 206 over serial bus 234. Using the serial bus 234 and 236 to transmit the prioritized data signal set from FPGA 206 and FPGA 220 reduces the number of connections and board space within each respective server.

Pullup resistors 228, coupled to each serial bus 234 and 236, enables each FPGA 206 and 220 to see a rising edge for asserting the data signal to each respective processing component (not illustrated) at the same time. For example, pullup resistor 228 coupled to serial bus 234 pulls up the data signal from FPGA 220 to FPGA 206. The other pullup resister 228 coupled to serial bus 236 pulls up the data signal from FPGA 206 to FPGA 220. In this manner, pullup resistors 228 are used to synchronize the prioritized data signal set between FPGAs 206 and 220 and/or processing components.

Further, although FIG. 2 illustrates eight connections (e.g., pins, solder traces, joints, etc) between each FPGA 206 and 220, implementations are not intended to be so limited as FPGAs 206 and 220 may include fewer connections to implement prioritized data signal set in the bridge system. As such, based on the example illustrated in FIG. 2, the electrical connections are provided as follows: The SBRIDGE_DIN electrical connection may provide serial data input;

SBRIDGE_SCLK_IN may include the serial clock input from clock 230 to transmit low skew and medium skew data signals on the rising clock edge; SBRIDGE_CLS_L_IN may include the chip select input so when low, data signals may be transmitted and may be latched; SBRIDGE_DOUT may include the serial data output; SBRIDGE_CLK_OUT may include the serial clock output; and SBRIDGE_CS_L_OUT may include the chip select output so when low, data signals may be transmitted and latched accordingly.

Figure 3:
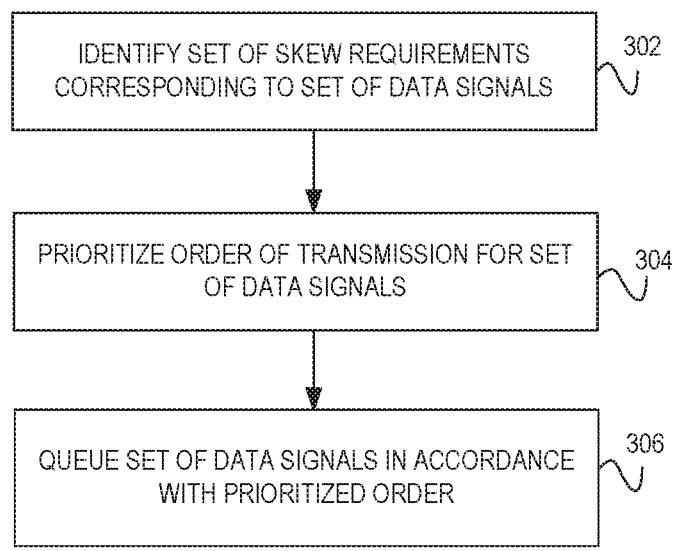
FIG. 3 is a flowchart of an example method to prioritize an order of a set of data signals based on a set of skew requirements in accordance with the present disclosure.
Figure 4:
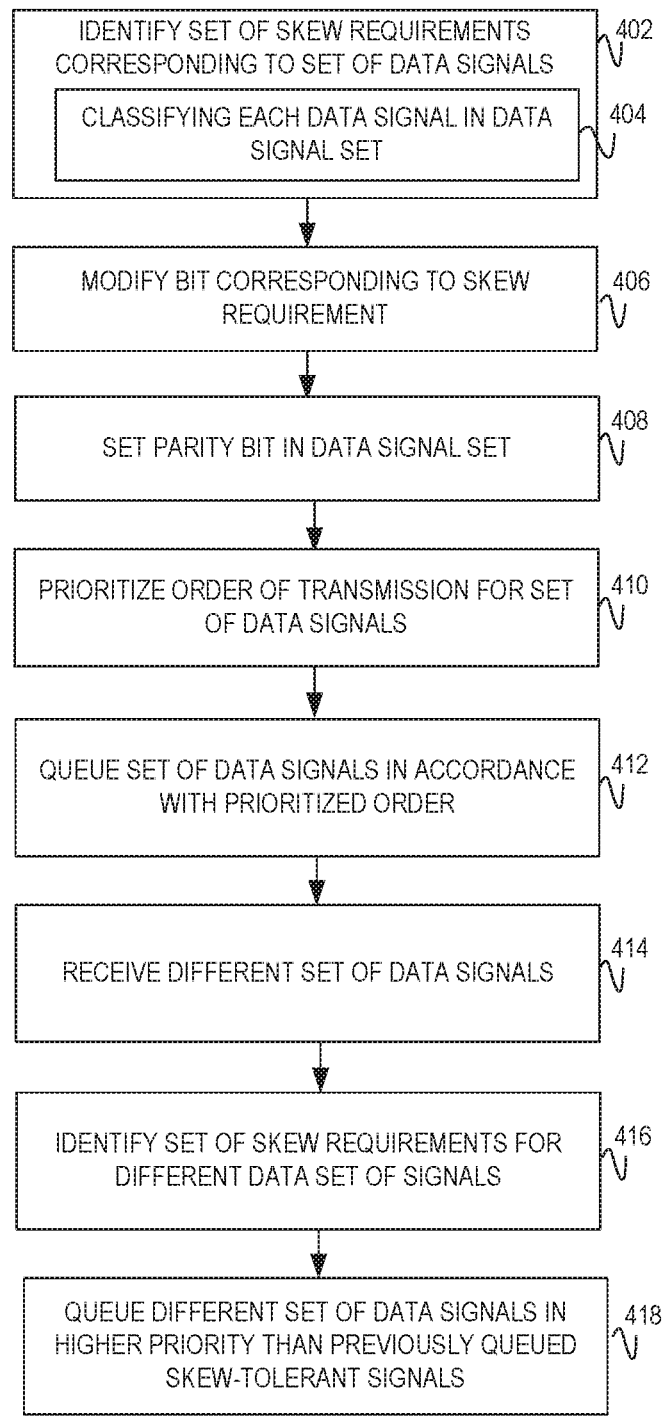
FIG. 4 is a flowchart of an example method to prioritize an order of a set of data signals for transmission based on a set of skew requirements in accordance with the present disclosure.

Referring now to FIGS. 3 and 4, example flowcharts are illustrated in accordance with various examples of the present disclosure. The flowcharts represent processes that may be utilized in conjunction with various systems and devices as discussed with reference to the preceding figures. While illustrated in a particular order, the flowcharts are not intended to be so limited. Rather, it is expressly contemplated that various processes may occur in different orders and/or simultaneously with other processes than those illustrated.

FIG. 3 is a flowchart of an example method, executable by an integrated circuit, to prioritize an order of a set of data signals based on a set of identified skew requirements. The integrated circuit receives the set of data signals and proceeds to identify a set of skew requirements corresponding to the data signal set. The set of skew requirements include low skew data signals, medium skew data signals, and/or skew-tolerant data signals. Based on identifying the set of skew requirements corresponding to the data signal set, the integrated circuit prioritizes an order of the data signal set for transmission. Upon prioritizing the order of the data signal set, the integrated circuit queues the data signal set for transmission. In discussing FIG. 3, references may be made to the components in FIGS. 1A-2 to provide contextual examples. In one implementation, first integrated circuit 106 works in conjunction with second integrated circuit 120 as in FIG. 1A to execute operations 302-306 to prioritize the order of data signals based on the skew requirements. Further, although FIG. 3 is described as implemented by an integrated circuit, it may be executed on other suitable components. For example, FIG. 3 may be implemented in the form of executable instructions on a machine-readable storage medium 504 and 604 as in FIGS. 5-6. In other implementations, the illustrated flowchart may be executed by a computing device.

At operation 302, the integrated circuit identifies the set of skew requirements corresponding to the set of data signals. The data signals represent various functionalities to perform on different integrated circuits. The set of skew requirements correspond to the set of data signals and as such may represent the various classes or levels of skew. For example, the levels of skew may include low skew data signals, medium skew data signals, and skew tolerant data signals (e.g., high skew data signals). In one implementation the type of data signal determines the level of skew. Upon identifying the set of skew requirements, the integrated circuit may proceed to prioritize the data signals.

At operation 304 based on the identified set of skew requirements, the integrated circuit proceeds to prioritize the data signal set in accordance to the skew requirements. In one implementation, the data signal set is prioritized based on the level of skew. The level of skew indicates which data signals should be synchronized across integrated circuits and/or processing components. For example, the low skew data signals may be prioritized highest followed by the medium skew data signals and skew tolerant data signals. Based on obtaining the prioritized data signal set, the integrated circuit may proceed to queue the data signals.

At operation 306, the integrated circuit queues the set of data signals in accordance with the prioritized order. The prioritized order specifies the sequence in which to transmit each data signal in the data signal set across a serial bus to another integrated circuit. The integrated circuit may place the prioritized data signal set in a memory component corresponding to the transmission order. Thus the highest prioritized data signals are placed closer to the serial bus than the lowest prioritized signals. Upon queuing the prioritized data signal set, the integrated circuit may proceed transmission of the data signals.

FIG. 4 is a flowchart of an example method, executable by an integrated circuit, to prioritize an order of data signal set for transmission based on a set of skew requirements. The integrated circuit identifies the set of skew requirements corresponding to the data signal set. Upon identifying the set of skew requirements, a bit in each data signal may be modified to represent the identified skew requirement. Additionally, the integrated circuit may proceed to set a parity bit in each data signal prior transmission for an error check by a receiving entity. Based on identifying the skew requirements, the integrated circuit prioritizes an order of the data signal set for transmission. Upon prioritizing the order of the data signal set, the integrated circuit queues the data signal set. In a further implementation, upon receiving a different data signal set, the integrated circuit proceeds to identify the skew requirements for the different data signal set. The integrated circuit proceeds to queue the low skew data signals in the different data signal set in higher priority for transmission prior to the previously queued skew-tolerant data signals in the data signal set. In discussing FIG. 4, references may be made to the components in FIGS. 1-2 to provide contextual examples. In one implementation, first integrated circuit 106 works in conjunction with second integrated circuit 120 as in FIG. 1A to execute operations 402-418 to prioritize the order of data signals based on the skew requirements. Further, although FIG. 4 is described as implemented by a computing device, it may be executed on other suitable components. For example, FIG. 4 may be implemented in the form of executable instructions on a machine-readable storage medium 504 and 604 as in FIGS. 5-6. In other implementations, the illustrated flowchart may be executed by a computing device.

At operation 402, the integrated circuit receives the data signal set and proceeds to identify the skew requirements corresponding to the data signals. Operation 402 may be similar in functionality to operation 302 as in FIG. 3.

At operation 406 based on the skew requirements corresponding to the data signal set, a bit in each data signal may be modified to represent the specific skew requirement. As explained in connection with FIG. 1A, each data signal may include 16 bits of information. As such, one of the bits may be modified by to represent which level of skew is tolerated by the given data signal. For example, each class of skew may be represented by a different numbered bit, such as bit nos. 10-13. Modifying the bit to high may indicate to the receiving entity what level of skew is associated with each data signal.

At operation 408, the integrated circuit may set the parity bit in each data signal in the set of data signals prior to transmission. Although FIG. 4 illustrates setting the parity bit and modifying the representative bit as occurring sequentially, implementations should not be so limited. For example, the parity bit may be set and the bit modification may occur at any operation prior to transmission.

At operation 410 based on the identification of the set of skew requirements corresponding to each data signal, the integrated circuit proceeds to prioritize the order of data signal set for transmission. In one implementation, the level of skew corresponding to the data signals indicates to the integrated circuit when to queue and transmit the data signal. Operation 410 may be similar in functionality to operation 304 as in FIG. 3.

At operation 412, the integrated circuit queues the set of data signals in accordance with prioritized order. Base on queueing the set of data signals, the integrated circuit may proceed to transmit data signals from highest priority to lowest priority to another integrated circuit. In another implementation, the data signals may be transmitted on a serial bus from the integrated circuit. In this implementation, the integrated circuit transmits the data signal set in sequential manner on the serial bus such that data signals highest in priority are transmitted prior to the lowest priority signals. Operation 412 may be similar to operation 306 as in FIG. 3.

At operation 414, the integrated circuit may receive a different set of data signals. The different set of data signals may include signals corresponding to the various levels of skew. As such, based on receiving the different set of data signals, the integrated circuit may proceed to identify the corresponding set of skew requirements.

At operation 416, the integrated circuit proceeds to identify the set of skew requirements which correspond to the different set of data signals. Operation 416 may be similar in functionality to operation 302 and operation 402.

At operation 418 based on the identified set of skew requirements corresponding to the different set of data signals, the integrated circuit queues the different set of data signal. In this implementation, the queued order of the initial data set is merged with the queuing of the different data signal set. As such, those data signals in the different data set which are highest prioritized (e.g., low skew data signals and/or medium skew data signals) are transmitted than any pending queued skew-tolerant signals. This enables the integrated circuit to continuously receive data signals, while ensuring those data signals corresponding to low skew and medium skew are transmitted prior to any previously queued skew-tolerant signals.

Figure 5:
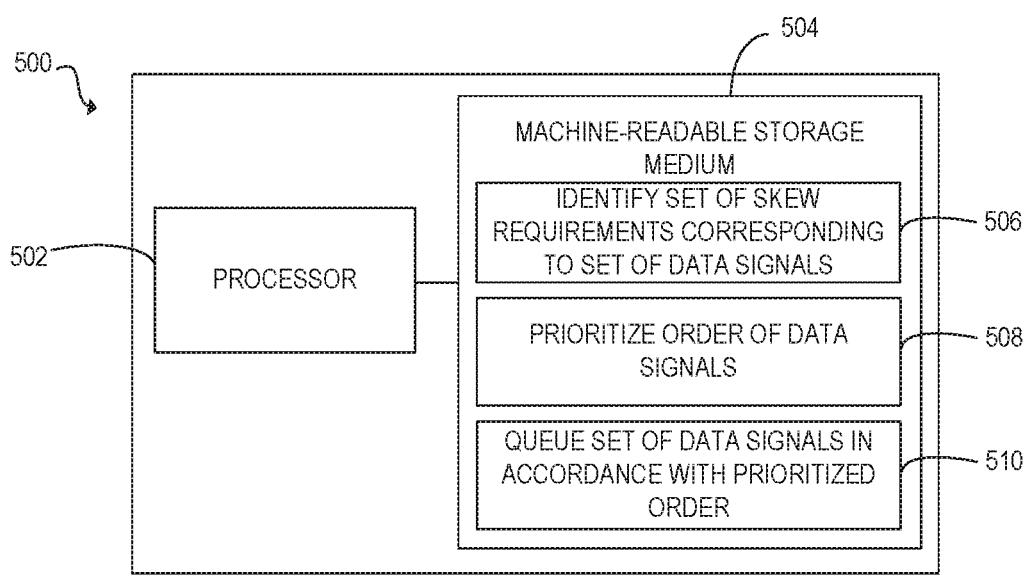
FIG. 5 is a block diagram of an example computing device with a processing resource to execute instructions in a machine-readable storage medium for queuing a set of data signals based on a prioritized order in accordance with the present disclosure.

Referring now to FIGS. 5 and 6, machine-readable instructions are illustrated in accordance with various examples of the present disclosure. While illustrated in a particular order, the machine-readable instructions are not intended to be so limited. Rather, it is expressly contemplated that various machine-readable instructions may occur in different orders and/or simultaneously with other machine-readable instructions.

FIG. 5 is a block diagram of computing device 500 with a processing resource 502 to execute instructions 506-510 within a machine-readable storage medium 504. Specifically, the computing device 500 with the processing resource 502 is to classify a set of data signals according to a set of skew requirements. Upon the classification of the set of data signals, the processing resource 502 may proceed to prioritize an order for the transmission of the data signals. Although the computing device 500 includes processing resource 502 and machine-readable storage medium 504, it may also include other components that would be suitable to one skilled in the art. For example, the computing device 500 may include first integrated circuit 106 as in FIG. 1A. In other examples, the computing device 500 may include a controller, memory storage, or other suitable type of component. The computing device 500 is an electronic device with the processing resource 502 capable of executing instructions 506-510 and as such embodiments of the computing device 500 include a networking device, networking switch, switch, router, computing device, server, or other type of networking component capable of executing instructions 506-510. The instructions 506-510 may be implemented as methods, functions, operations, and other processes implemented as machine-readable instructions stored on the storage medium 504, which may be non-transitory, such as hardware storage devices (e.g., random access memory (RAM), read only memory (ROM), erasable programmable ROM, electrically erasable ROM, hard drives, and flash memory).

The processing resource 502 may fetch, decode, and execute instructions 506-510 to queue the set of data signals in accordance with the prioritized order. Specifically, the processing resource 502 executes instructions 506-510 to: classify the set of data signals according to the set of skew requirements; upon classification of the set of data signals, prioritize the order of the data signals such that a lower skew data signal ranks higher in priority than a skew-tolerant data signal; and based on the prioritized order, queue the set of data signals for transmission.

The machine-readable storage medium 504 includes instructions 506-510 for the processing resource 502 to fetch, decode, and execute. In another embodiment, the machine-readable storage medium 504 may be an electronic, magnetic, optical, memory, storage, flash-drive, or other physical device that contains or stores executable instructions. Thus, the machine-readable storage medium 504 may include, for example, Random Access Memory (RAM), an Electrically Erasable Programmable Read-Only Memory (EEPROM), a storage drive, a memory cache, network storage, a Compact Disc Read Only Memory (CDROM) and the like. As such, the machine-readable storage medium 504 may include an application and/or firmware which can be utilized independently and/or in conjunction with the processing resource 502 to fetch, decode, and/or execute instructions of the machine-readable storage medium 504. The application and/or firmware may be stored on the machine-readable storage medium 504 and/or stored on another location of the computing device 500.

FIG. 6 is a block diagram of computing device 600 with a processing resource 602 to execute instructions 606-622 within a machine-readable storage medium 604. Specifically, the computing device 600 with the processing resource 602 is to prioritize an order for transmission of a set of data signals. The prioritized order prioritizes low skew data signals over medium skew data signals and skew tolerant data signals. Upon obtaining the prioritized order, the processing resource 602 may proceed to queue and transmit the set of data signals. Although the computing device 600 includes processing resource 602 and machine-readable storage medium 604, it may also include other components that would be suitable to one skilled in the art. For example, the computing device 600 may include first integrated circuit 106 as in FIG. 1A. In other examples, the computing device 600 may include a controller, memory storage, or other suitable type of component. The computing device 600 is an electronic device with the processing resource 602 capable of executing instructions 606-622 and as such embodiments of the computing device 600 include a networking device, networking switch, switch, router, computing device, server, or other type of networking component capable of executing instructions 606-622. The instructions 606-622 may be implemented as methods, functions, operations, and other processes implemented as machine-readable instructions stored on the storage medium 604, which may be non-transitory, such as hardware storage devices (e.g., random access memory (RAM), read only memory (ROM), erasable programmable ROM, electrically erasable ROM, hard drives, and flash memory).

The processing resource 602 may fetch, decode, and execute instructions 606-622 to queue and transmit the set of data signals in accordance with the prioritized order. Specifically, the processing resource 602 executes instructions 606-622 to: identify the specific skew requirement for each data signal in the data signal set including whether the specific skew requirement includes the low skew data signal, medium skew data signal, and/or skew-tolerant data signal; modify a bit in each data signal in the set, the bit modification represents the specific skew requirement; set a parity bit in each data signal prior to transmission, the parity bit may be used by the receiving entity to check for any errors in the transmission of each data signal; prioritize the order of the set of data signals based on the specific skew requirements such that low skew data signal ranks highest in priority, medium priority for the low skew data signal with high latency, and lowest priority for the skew-tolerant high latency data signals; queue the data signal set in accordance with the prioritized order, the higher ranking or highest prioritized data signals are placed higher in order for transmission; transmit the data signals based on the prioritized order, the higher ranking data signals are transmitted prior to transmission of the medium skew data signals and the skew-tolerant data signals; classify a different set of data signals according to the various skew requirements corresponding to each data signal; and queue the low skew data signals in the different set of data signals in higher priority for transmission prior to the skew-tolerant data signals in the initial set of data signals.

The machine-readable storage medium 604 includes instructions 606-622 for the processing resource 602 to fetch, decode, and execute. In another embodiment, the machine-readable storage medium 604 may be an electronic, magnetic, optical, memory, storage, flash-drive, or other physical device that contains or stores executable instructions. Thus, the machine-readable storage medium 604 may include, for example, Random Access Memory (RAM), an Electrically Erasable Programmable Read-Only Memory (EEPROM), a storage drive, a memory cache, network storage, a Compact Disc Read Only Memory (CDROM) and the like. As such, the machine-readable storage medium 604 may include an application and/or firmware which can be utilized independently and/or in conjunction with the processing resource 602 to fetch, decode, and/or execute instructions of the machine-readable storage medium 604. The application and/or firmware may be stored on the machine-readable storage medium 604 and/or stored on another location of the computing device 600.

Although certain implementations have been illustrated and described herein, it will be appreciated that a wide variety of alternate and/or equivalent implementations calculated to achieve the same purposes may be substituted for the implementations shown and described without departing from the scope of this disclosure. Those with skill in the art will readily appreciate that implementations may be implemented in a variety of ways. This application is intended to cover adaptions or variations of the implementations discussed herein. Therefore, it is manifestly intended that implementations be limited only by the claims and equivalents thereof.

We claim:

1. A method executed by an integrated circuit, the method comprising:

identifying skew requirements corresponding to data signals of a set of data signals, wherein a respective skew requirement for a corresponding data signal of the set of data signals represents an amount of skew for the corresponding data signal, the amount of skew based on a time difference between transitions of the corresponding data signal at different components;

based on the skew requirements, prioritizing an order of transmission for the set of data signals; and queuing the set of data signals in accordance with the prioritized order, wherein a data signal corresponding to a lower skew requirement has a higher ordered priority than a skew-tolerant data signal corresponding to a higher skew requirement.

2. The method of claim 1, comprising:

transmitting the set of data signals in a serial manner based on the prioritized order.

3. The method of claim 1, comprising:

modifying a skew indication in the corresponding data signal based on the respective skew requirement, the skew indication representing the respective skew requirement, wherein the queuing of the set of data signals in accordance with the prioritized order is based on skew indications included in the data signals of the set of data signals, the skew indications comprising the skew indication modified in the corresponding data signal.

4. The method of claim 3, wherein the modifying of the skew indication in the corresponding data signal comprises modifying a bit in the corresponding data signal.

5. The method of claim 4, wherein different bits in the corresponding data signal represent different skew requirements.

6. The method of claim 1, comprising:

after the queuing of the set of data signals in accordance with the prioritized order, receiving a different set of data signals;

identifying skew requirements corresponding to the data signals of the different set of data signals;

based on the skew requirements corresponding to the data signals of the different set of data signals, prioritizing an order of transmission for the different set of data signals; and merging the data signals of the different set of data signals in a queue with data signals of the set of data signals, the merging being according to the prioritized order of transmission for the set of data signals and the prioritized order of transmission for the different set of data signals, wherein a data signal of the different set of data signals having a higher priority is queued for earlier transmission than a previously queued skew-tolerant signal of the set of data signals having a lower priority.

7. The method of claim 6, wherein the data signals of the different set of data signals include a low skew data signal, a medium skew data signal, and a high skew data signal, wherein the low skew data signal is a low skew and low latency data signal, the medium skew data signal is a low skew and high latency data signal, and the high skew data signal is a high skew and high latency data signal.

8. The method of claim 1, comprising:

classifying each data signal in the set of data signals according to the skew requirements.

9. A system comprising:

a first integrated circuit to:

identify skew requirements corresponding to a set of data signals, wherein a respective skew requirement for a corresponding data signal of the set of data signals represents an amount of skew for the corresponding data signal, the amount of skew based on a time difference between transitions of the corresponding data signal at different components;

based on the skew requirements, prioritize an order of the data signals of the set of data signals, wherein a data signal corresponding to a lower skew requirement has a higher priority than a skew-tolerant data signal corresponding to a higher skew requirement;

queue the set of data signals in accordance with the prioritized order; and a second integrated circuit to receive the set of data signals based on the prioritized order.

10. The system of claim 9, comprising:

a synchronization clock, coupled to the first integrated circuit and the second integrated circuit, to provide timing for transmission of the data signal corresponding to the lower skew requirement, wherein the first integrated circuit is to transmit the data signal corresponding to the lower skew requirement based on a transition of the synchronization clock.

11. The system of claim 9, comprising:

a serial bus, coupled between the first integrated circuit and the second integrated circuit, to transmit the set of data signals in a serial manner according to the prioritized order.

12. The system of claim 11, comprising:

a pull-up resistor, coupled to the serial bus, to synchronize the set of data signals between the first integrated circuit and the second integrated circuit.

13. The system of claim 9, wherein the first integrated circuit and the second integrated circuit are full-duplex capable circuits.

14. The system of claim 9, wherein the first integrated circuit is to:

modify a skew indication in the corresponding data signal based on the respective skew requirement, the skew indication representing the respective skew requirement, wherein the queuing of the set of data signals in accordance with the prioritized order is based on skew indications included in the data signals of the set of data signals, the skew indications comprising the skew indication modified in the corresponding data signal.

15. The system of claim 14, wherein the modifying of the skew indication in the corresponding data signal comprises modifying a bit in the corresponding data signal, and wherein different bits in the corresponding data signal represent different skew requirements.

16. A non-transitory machine-readable storage medium comprising instructions that when executed cause a processing resource to:

identify skew requirements corresponding to a set of data signals, wherein a respective skew requirement for a corresponding data signal of the set of data signals represents an amount of skew for the corresponding data signal, the amount of skew based on a time difference between transitions of the corresponding data signal at different components;

based on the skew requirements, prioritize an order of the data signals of the set of data signals for transmission, wherein a data signal corresponding to a lower skew requirement has a higher priority than a data signal corresponding to a higher skew requirement; and queue the set of data signals in accordance with the prioritized order.

17. The non-transitory machine-readable storage medium of claim 16, wherein the instructions when executed cause the processing resource to:

after the queuing of the set of data signals in accordance with the prioritized order, receive a different set of data signals;

identify skew requirements corresponding to the data signals of the different set of data signals;

based on the skew requirements corresponding to the data signals of the different set of data signals, prioritize an order of transmission for the different set of data signals; and merge the data signals of the different set of data signals in a queue with data signals of the set of data signals, the merging being according to the prioritized order of transmission for the set of data signals and the prioritized order of transmission for the different set of data signals, wherein a data signal of the different set of data signals having a higher priority is queued for earlier transmission than a previously queued skew-tolerant signal of the set of data signals having a lower priority.

18. The non-transitory machine-readable storage medium of claim 16, wherein the instructions when executed cause the processing resource to:

modify a skew indication in the corresponding data signal based on the respective skew requirement, the skew indication representing the respective skew requirement, wherein the queuing of the set of data signals in accordance with the prioritized order is based on skew indications included in the data signals of the set of data signals, the skew indications comprising the skew indication modified in the corresponding data signal.

19. The non-transitory machine-readable storage medium of claim 16, wherein the instructions when executed cause the processing resource to:

transmit the set of data signals in a serial manner based on the prioritized order.

* * * * *